(12) United States Patent
Sasaki et al.

(10) Patent No.: US 9,535,112 B2
(45) Date of Patent: Jan. 3, 2017

(54) TEMPERATURE CONTROL APPARATUS AND TEST SYSTEM USING MAIN FLOW PATH AND SUB FLOW PATH

(71) Applicant: ADVANTEST CORPORATION, Tokyo (JP)

(72) Inventors: Hirotaka Sasaki, Tokyo (JP); Tsuyoshi Yamashita, Gunma (JP); Noboru Masuda, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 183 days.

(21) Appl. No.: 14/472,398

(22) Filed: Aug. 29, 2014

(65) Prior Publication Data

US 2015/0268295 A1    Sep. 24, 2015

(30) Foreign Application Priority Data

Mar. 18, 2014   (KR) .............................. 2014-0031529

(51) Int. Cl.
*G01R 31/10* (2006.01)
*G01R 31/28* (2006.01)

(52) U.S. Cl.
CPC ........... *G01R 31/2875* (2013.01); *G01R 31/28* (2013.01); *G01R 31/2851* (2013.01)

(58) Field of Classification Search
CPC ................ F28F 9/26; F28F 3/12; F28F 27/00; F28F 27/02; F28F 1/00; F28F 2200/00; F28F 2260/02; F28F 27/003; F28F 9/0268; F28F 13/06; H01L 21/67109; H01L 21/6719; H01L 21/67196; H01L 21/67248; H01L 21/67253; H01L 21/67288; H01L 21/67703; H01L 21/67739; H01L 21/324; H01L 23/53238; G05D 23/1951; G05D 23/1393; G05D 23/1858; G05D 23/19; G05D 23/192; G05D 7/0623; G01R 31/2875

See application file for complete search history.

(56) References Cited

U.S. PATENT DOCUMENTS

| | | |
|---|---|---|
| 2010/0175866 A1 | 7/2010 | Tani et al. |
| 2010/0224352 A1* | 9/2010 | Stuckey .............. H01L 23/4735 165/185 |
| 2014/0262199 A1* | 9/2014 | Kobayashi ......... G05D 23/1934 165/294 |
| 2015/0176928 A1* | 6/2015 | Tabuchi ................. G05D 23/19 165/96 |

OTHER PUBLICATIONS

Office Action issued for counterpart Taiwanese Application 103132490, issued by the Taiwan Intellectual Property Office on Mar. 11, 2016.

* cited by examiner

*Primary Examiner* — Vinh Nguyen (57) ABSTRACT

Increase in number of valves complicates the configuration and control. A temperature control apparatus for controlling a temperature of a device, includes; a heat exchange section exchanging heat with the device; a main flow path causing a fluid to flow; a sub flow path causing, to flow, a fluid having a temperature different from a temperature of the fluid flowing through the main flow path; a mixture flow path merging the fluids from the main flow path and the sub flow path and causing the merged fluids to flow to the heat exchange section; and a flow rate adjusting section adjusting an amount of a fluid flowing from the sub flow path to the mixture flow path, in relation to the fluid flowing through the main flow path.

16 Claims, 7 Drawing Sheets

|  | SPARE CHAMBER | TEST CHAMBER | CHILLER SECTION | TOTAL |
|---|---|---|---|---|
| NUMBER OF VALVES | 16 | 16 | 0 | 32 |

*FIG. 8*

|  | SPARE CHAMBER | TEST CHAMBER | CHILLER SECTION | TOTAL |
|---|---|---|---|---|
| NUMBER OF VALVES | 8 | 8 | 4 | 20 |

*FIG. 9*

FIG. 10

TEMPERATURE CONTROL APPARATUS AND TEST SYSTEM USING MAIN FLOW PATH AND SUB FLOW PATH

BACKGROUND

1. Technical Field

The present invention relates to a temperature control apparatus and a test system.

2. Related Art

Conventionally, a temperature control apparatus for heating or cooling the target to have the targeted temperature by supplying fluids in two systems having different temperatures while adjusting the respective flow rates using valves is known (e.g., Patent Document 1).

Patent Document 1: Japanese Patent Application Publication No. 2011-526357 (translation of PCT application)

However, with the above-mentioned temperature control apparatus, the flow rates are adjusted by providing a valve on the flow path for a high temperature fluid and a valve on the flow path for a low temperature fluid, which requires many valves to complicate the configuration and control.

SUMMARY

Therefore, it is an object of an aspect of the innovations herein to provide a temperature control apparatus and a test system, which are capable of overcoming the above drawbacks accompanying the related art. The above and other objects can be achieved by combinations described in the independent claims. According to a first aspect related to the innovations herein, provided is a temperature control apparatus for controlling a temperature of a device, includes; a heat exchange section exchanging heat with the device; a main flow path causing a fluid to flow; a sub flow path causing, to flow, a fluid having a temperature different from a temperature of the fluid flowing through the main flow path; a mixture flow path merging the fluids from the main flow path and the sub flow path and causing the merged fluids to flow to the heat exchange section; and a flow rate adjusting section adjusting an amount of a fluid flowing from the sub flow path to the mixture flow path, in relation to the fluid flowing through the main flow path.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
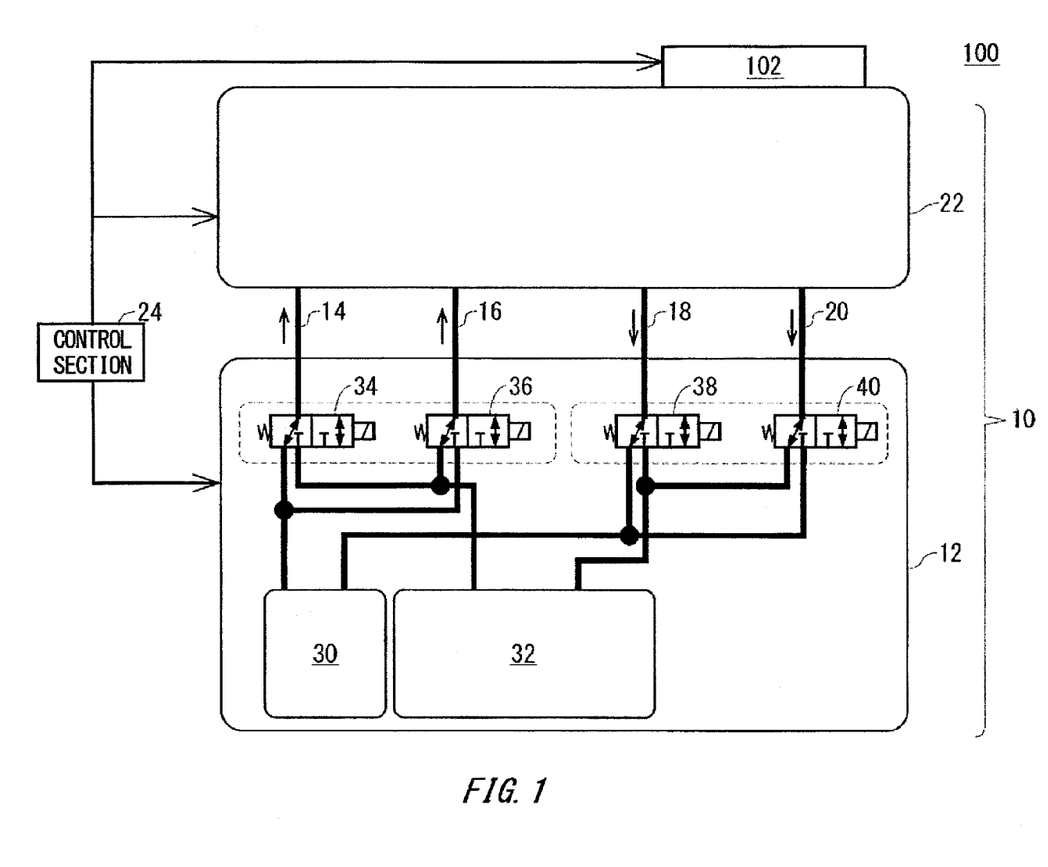
FIG. 1 is an configuration overview of a test system 100.

FIG. 1 is an configuration overview of a test system 100. The test system 100 includes a test apparatus 102 and a temperature control apparatus 10. The temperature control apparatus 10 controls the temperature of a device such as a device under test DUT, to realize a high-temperature test and a low-temperature test. The test apparatus 102 tests a device under test DUT whose temperature has been controlled by the temperature control apparatus 10. An example of a device under test DUT is an analogue circuit, a digital circuit, a memory, and a system on chip (SOC), or the like. The test apparatus 102 inputs, to a device under test DUT, a test signal based on a test pattern for testing the device under test DUT, and determines good or bad of the device under test DUT based on an output signal outputted by the device under test DUT according to the test signal. The temperature control apparatus 10 enables reduction in number of valves on the flow path on which a fluid for controlling the temperature flows, thereby simplifying the configuration and control. The temperature control apparatus 10 includes a chiller section 12, a main flow path 14, a sub flow path 16, a main return flow path 18, a sub return flow path 20, a handler section 22, and a control section 24.

The chiller section 12 includes a first fluid source 30, a second fluid source 32, a main switch 34, a sub switch 36, a main return switch 38, and a sub return switch 40.

The first fluid source 30 causes the first fluid FL1 to flow in the main flow path 14 or the sub flow path 16, by adjusting the temperature of the first fluid FL1 to a first temperature. When the first fluid source 30 is connected to the main flow path 14, the first fluid source 30 receives the mixed fluid FLm having flown through a heat exchange section of a handler section 22 described later, via the main return flow path 18. When the first fluid source 30 is connected to the sub flow path 16, the first fluid source 30 receives the first fluid FL1 not having flown through the heat exchange section of the handler section 22 and thus not subjected to heat exchange, via the sub return flow path 20. The first fluid source 30 adjusts the first temperature according to the targeted temperature of the fluid. The first fluid FL1 is preferably a liquid being electrically insulating, incombustible, and having high flowability even at low temperatures. An example of the first fluid FL1 is a brine of fluorine series inert solution.

The second fluid source 32 causes the second fluid FL2 to flow through the sub flow path 16 or the main flow path 14, by adjusting the temperature of the second fluid FL2 to the second temperature. In the present embodiment, an example in which the first temperature is higher than the second temperature is explained. The second fluid source 32 adjusts the second temperature according to the targeted temperature of the fluid. The second fluid source 32 is connected to one of the sub flow path 16 and the main flow path 14, which is not connected to the first fluid source 30. When connected to the sub flow path 16, the second fluid source 32 receives the second fluid FL2 not having flown through the heat exchange section and thus not subject to heat exchange, via the sub return flow path 20. When the second fluid source 32 is connected to the main flow path 14, the second fluid source 32 receives the fluid having flown through the heat exchange section, via the main return flow path 18. The second fluid FL2 is the same as the first fluid FL1 except the temperature.

An example of the main switch 34, the sub switch 36, the main return switch 38, and the sub return switch 40 is a valve having three ports, capable of switching the flow paths in accordance with an instruction by the control section 24. The valve having three ports used in the present embodiment has one input and two outputs. The main switch 34 switches which one of the first fluid source 30 and the second fluid source 32 is connected to the main flow path 14. The sub switch 36 switches so that one of the first fluid source 30 and the second fluid source 32, which is not connected to the main flow path 14, is connected to the sub flow path 16.

The main return switch 38 connects, to the main return flow path 18, one of the first fluid source 30 and the second fluid source 32, which is connected to the main flow path 14. The sub return switch 40 connects, to the sub return flow path 20, one of the first fluid source 30 and the second fluid source 32, which is connected to the sub flow path 16.

The main flow path 14 causes the fluid to flow from the chiller section 12 to the handler section 22. For example, when the main flow path 14 is connected to the first fluid source 30 via the main switch 34, the main flow path 14 causes the first fluid FL1 supplied from the first fluid source 30 to flow. When the main flow path 14 is connected to the second fluid source 32 via the main switch 34, the main flow path 14 causes the second fluid FL2 supplied from the second fluid source 32 to flow.

The sub flow path 16 causes a fluid whose temperature differs from the temperature of the fluid flowing through the main flow path 14, from the chiller section 12 to the handler section 22. For example, when the sub flow path 16 is connected to the first fluid source 30 via the sub switch 36, the sub flow path 16 causes the first fluid FL1 supplied from the first fluid source 30 to flow. When the sub flow path 16 is connected to the second fluid source 32 via the sub switch 36, the sub flow path 16 causes the second fluid FL2 supplied from the second fluid source 32 to flow. The cross-section area of the inside of the sub flow path 16 may be smaller than the cross-section area of the inside of the main flow path 14. For example, the cross-section area of the inside of the sub flow path 16 is equal to or below ½ of the cross-section area of the inside of the main flow path 14, or equal to or below ¾ of the cross-section area of the inside of the main flow path 14. The cross-section area of the inside of the sub flow path 16 in relation to the cross-section area of the inside of the main flow path 14 may be determined based on the difference in temperature between the fluid for flowing through the main flow path 14 and the fluid for flowing through the sub flow path 16. Accordingly, the pressure of the fluid flowing through the sub flow path 16 can be raised with a lower flow rate.

In addition, the pressure of the fluid flowing through the sub flow path 16 may be set higher than the pressure of the fluid flowing through the main flow path 14. In an example, when the pressure of the fluid flowing through the main flow path 14 is 0.4 MPa, the pressure of the fluid flowing through the sub flow path 16 is 0.5 MPa. Note that the difference between the pressure of the fluid flowing through the sub flow path 16 and the pressure of the fluid flowing through the main flow path 14 may be 0.05 MPa-0.34 MPa. The ratio of the pressure of the fluid flowing through the sub flow path 16 to the pressure of the fluid flowing through the main flow path 14 may be 110%-200%. By doing so, it becomes possible to assuredly mix the first fluid FL1 flowing through the main flow path 14 and the second fluid FL2 flowing through the sub flow path 16.

The main return flow path 18 causes the fluid returned from the handler section 22 to either the first fluid source 30 or the second fluid source 32. For example, when the first fluid source 30 is connected to the main flow path 14, the main return flow path 18 is connected to the first fluid source 30 by the main return switch 38, thereby causing the returned fluid to flow to the first fluid source 30. When the second fluid source 32 is connected to the main flow path 14, the main return flow path 18 is connected to the second fluid source 32 by the main return switch 38, thereby causing the returned fluid to flow to the second fluid source 32.

The sub return flow path 20 causes the fluid returned from the handler section 22 to either the first fluid source 30 or the second fluid source 32. For example, when the first fluid source 30 is connected to the sub flow path 16, the sub return flow path 20 is connected to the first fluid source 30 by the sub return switch 40, thereby causing the returned fluid to flow to the first fluid source 30. When the second fluid source 32 is connected to the sub flow path 16, the sub return flow path 20 is connected to the second fluid source 32 by the sub return switch 40, thereby causing the returned fluid to flow to the second fluid source 32.

The control section 24 is connected to the chiller section 12 and the handler section 22 so as to be able to transmit and receive signals to and from the chiller section 12 and the handler section 22. The control section 24 manages the entire control of the temperature control apparatus 10 and the test apparatus 102. For example, the control section 24 is a computer including an operation section such as CPU and a storage section.

Figure 2:
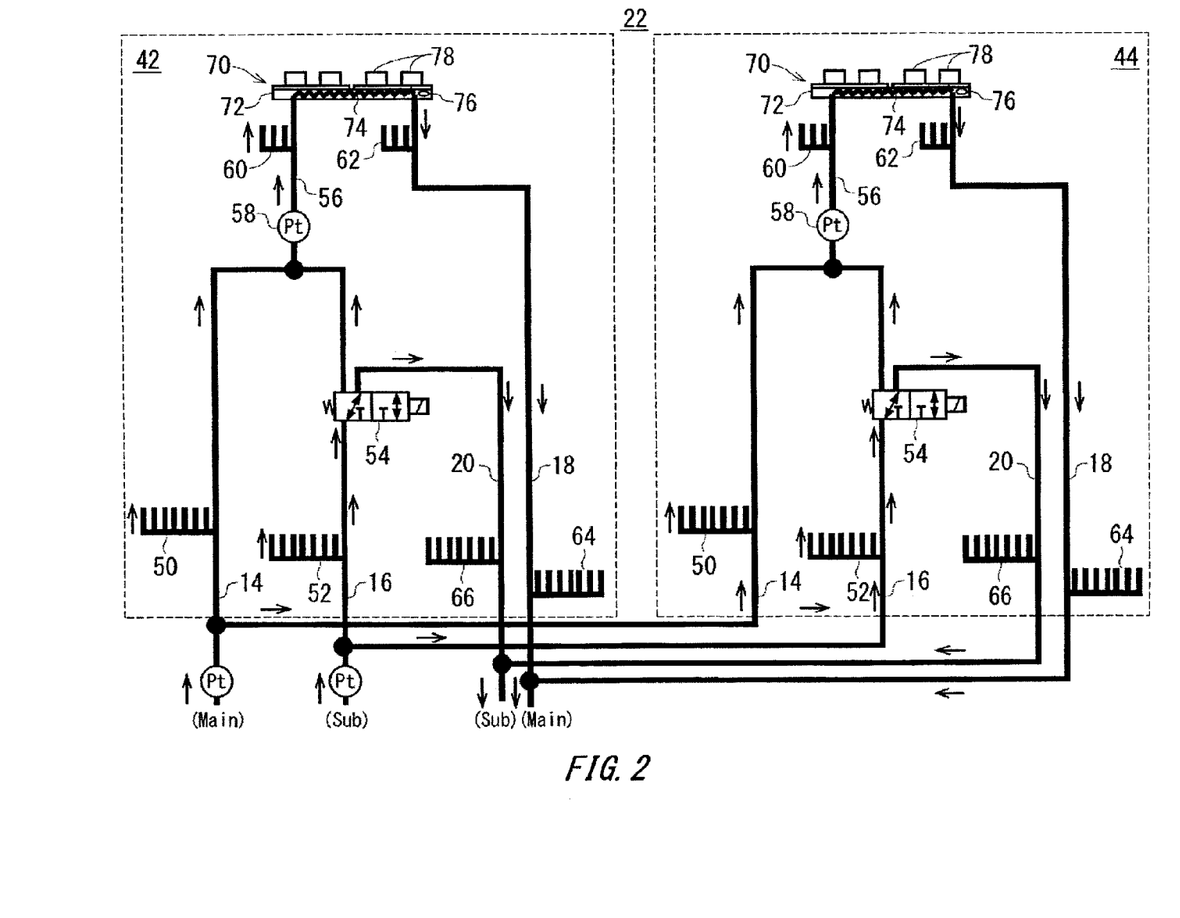
FIG. 2 is a configuration overview of a handler section 22.

FIG. 2 is a configuration overview of a handler section 22. The handler section 22 includes a preheating chamber (Soak) 42 and a test section (Test) 44. The preheating chamber 42 heats or cools in advance a device under test DUT conveyed to the test section 44. The test section 44 tests the device under test DUT while heating or cooling the device under test DUT. In the present embodiment, the preheating chamber 42 and the test section 44 are connected in parallel to each other.

The preheating chamber 42 includes a main branch section 50, a sub branch section 52, a plurality of flow rate adjusting sections 54, a plurality of mixture flow paths 56, a plurality of flow path temperature detecting sections 58, a mixture branch section 60, a mixture merge section 62, a main merge section 64, a sub merge section 66, and a plurality of heat exchange section 70.

In the handler section 22, the main flow path 14 and the sub flow path 16 respectively branch to the mixture flow paths 56 of the preheating chamber 42 and the test section 44. The main return flow path 18 and the sub return flow path 20 provided respectively for the preheating chamber 42 and the test section 44 extend from the heat exchange section 70. The main return flow paths 18 and the sub return flow paths 20 merge in each of the preheating chamber 42 and the test section 44, to extend to the chiller section 12.

The main branch section 50 is provided halfway through the main flow path 14. The main branch section 50 branches the fluid from the main switch 34, to cause it to flow to the plurality of main flow paths 14. The number of branches of the main branch section 50 is set according to the number of heat exchange sections 70 set in the preheating chamber 42. For example, the number of branches of the main branch section 50 is eight.

The sub branch section 52 is provided halfway through the sub flow path 16. The sub branch section 52 branches the fluid from the sub switch 36, to cause it to flow to the plurality of sub flow paths 16. The number of branches of the sub branch section 52 is set according to the number of heat exchange sections 70 set in the preheating chamber 42. Accordingly, the number of branches of the sub branch section 52 is normally eight, being the same as the number of branches of the main branch section 50.

The flow rate adjusting section 54 adjusts the amount of the fluid flowing to the mixture flow path 56 from the sub flow path 16, in relation to the fluid flowing through the main flow path 14. For example, the flow rate adjusting section 54 is a valve having three ports provided halfway through the sub flow path 16. Note that the flow rate adjusting section 54 is provided halfway through all the sub flow paths 16 branched by the sub branch section 52. The flow rate adjusting section 54 switches the connection destination of the sub flow path 16 extending from the chiller section 12, between the sub flow path 16 extending to the mixture flow path 56 and the sub return flow path 20. The flow rate adjusting section 54 adjusts the amount of mixture of both fluids by switching the connection destination. By doing so, the flow rate adjusting section 54 adjusts the flow rate of the fluid flowing from the sub flow path 16 to the mixture flow path 56 while maintaining the flow rate of the fluid flowing from the main flow path 14 to the mixture flow path 56.

One end of the mixture flow path 56 is connected to the main flow path 14 and the sub flow path 16. The other end of the mixture flow path 56 is connected to the heat exchange section 70. The mixture flow path 56 causes the mixed fluid FLm, which is a mix of the fluids flowing from the main flow path 14 and the sub flow path 16, to flow to the heat exchange section 70

The flow path temperature detecting section 58 is provided halfway through the mixture flow path 56. The flow path temperature detecting section 58 detects the temperature of the mixed fluid FLm, which is a mix of the fluid flowing through the main flow path 14 and the fluid flowing through the sub flow path 16, and outputs the temperature information to the control section 24.

The mixture branch section 60 is provided halfway through the mixture flow path 56, and branches the mixture flow path 56. The number of branches of the mixture branch section 60 is set according to the number of pushers 78 installed in a single heat exchange section 70 described later. For example, the number of branches of the mixture branch section 60 is four.

The mixture merge section 62 merges the main return flow path 18 extending from each pusher 78. The number of merges of the mixture merge section 62 is set according to the number of pushers 78. Accordingly, the number of merges of the mixture merge section 62 is four, being the same as the number of branches of the mixture branch section 60.

The main merge section 64 merges the mixed fluid FLm from the main return flow path 18 extending from each heat exchange section 70, to cause it to flow to the main return switch 38. The number of merges of the main merge section 64 is set according to the number of heat exchange sections 70. Accordingly, the number of merges of the main merge section 64 is eight, being the same as the number of branches of the main branch section 50.

The sub merge section 66 merges the fluid from the sub return flow path 20 extending from each flow rate adjusting section 54, to cause it flow to the sub return switch 40. The number of merges of the sub merge section 66 is set according to the number of heat exchange sections 70. Accordingly, the number of merges of the sub merge section 66 is eight, being the same as the number of branches of the sub branch section 52.

The heat exchange section 70 includes a heat sink 72, a heat exchange flow path 74, an exchange temperature detecting section 76, and a pusher 78. The heat sink 72 is a plate-like member, and supports the pusher 78 pressing the device under test DUT. For example, the heat sink 72 supports four pushers 78. The heat exchange flow path 74 is provided in the heat sink 72. The heat exchange flow path 74 is installed between the mixture flow path 56 and the main return flow path 18. The heat exchange flow path 74 is provided with a mixed fluid Flm from the mixture flow path 56. The heat exchange section 70 exchanges heat with the device under test DUT by means of this mixed fluid FLm, and preheats (including heating or cooling) the device under test DUT. The heat exchange flow path 74 causes the mixed fluid FLm having been subjected to heat exchange, to the main return flow path 18. The exchange temperature detecting section 76 detects the temperature of the heat exchange section 70 and outputs temperature information. The pusher 78 presses the device under test DUT from below.

The test section 44 includes a main branch section 50, a sub branch section 52, a plurality of flow rate adjusting sections 54, a plurality of mixture flow paths 56, a plurality of flow path temperature detecting sections 58, a mixture branch section 60, a mixture merge section 62, a main merge section 64, a sub merge section 66, and a plurality of heat exchange sections 70. Each configuration of the test section 44 is substantially the same as each configuration of the preheating chamber 42, and so the explanation thereof is omitted. The heat exchange section 70 of the test section 44 exchanges the heat with the device under test DUT being tested, to adjust the temperature.

Note that as described above, the temperature control apparatus 10 includes a plurality of sets of heat exchange section 70, main flow path 14, sub flow path 16, mixture flow path 56, main return flow path 18, sub return flow path 20, and flow rate adjusting section 54.

Figure 3:
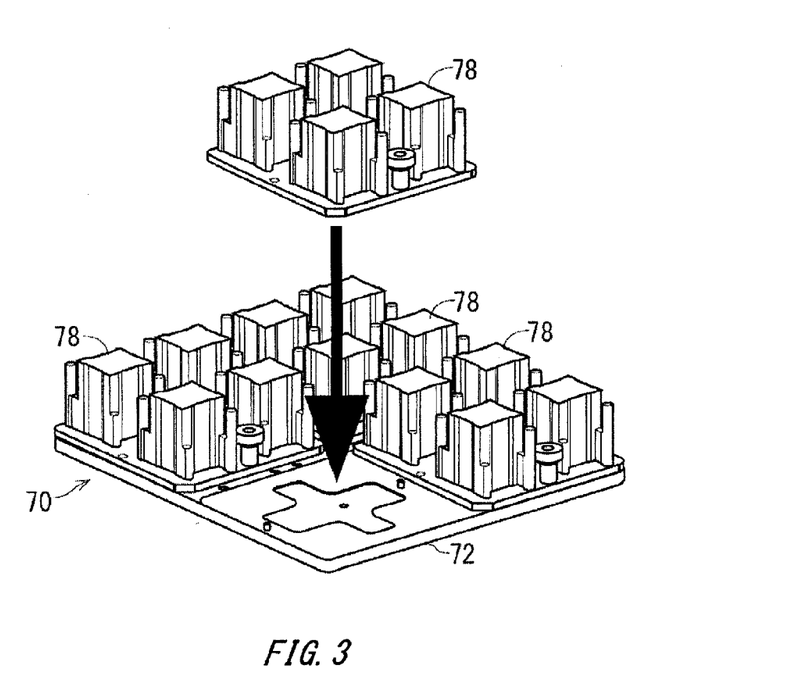
FIG. 3 is a perspective view in the vicinity of a heat exchange section 70.

FIG. 3 is a perspective view in the vicinity of the heat exchange section 70. As shown in FIG. 3, the heat exchange section 70 supports four pushers 78 aligned in 2 by 2 formation. Each pusher 78 presses four devices under test DUT aligned in 2 by 2 formation.

Figure 4:
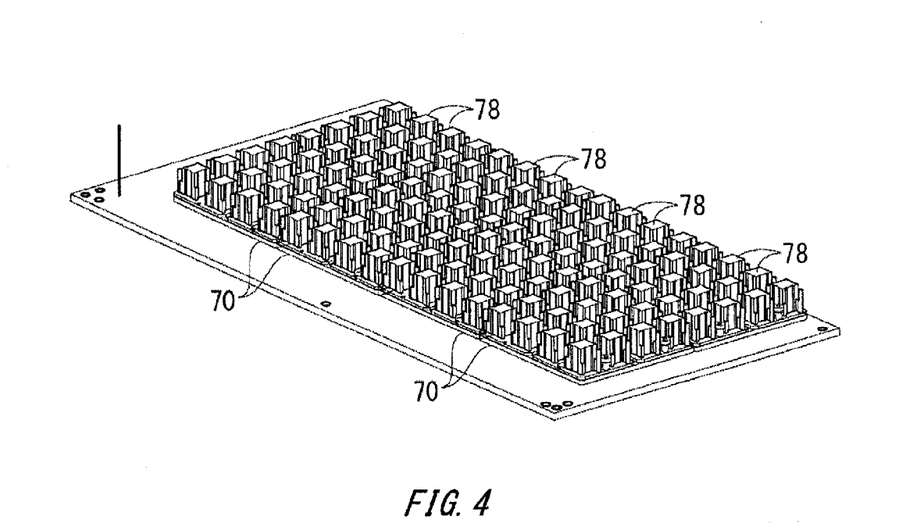
FIG. 4 is a perspective view of eight heat exchange sections 70.

FIG. 4 is a perspective view of eight heat exchange sections 70. As shown in FIG. 4, the eight heat exchange sections 70 are aligned in 2 by 4 formation. In an example, the number of heat exchange sections 70 aligned in the preheating chamber 42 or the test section 44 at once is 16. In this case, the number of devices under test DUT provided in the preheating chamber 42 or the test section 44 at once is 512.

Figure 5:
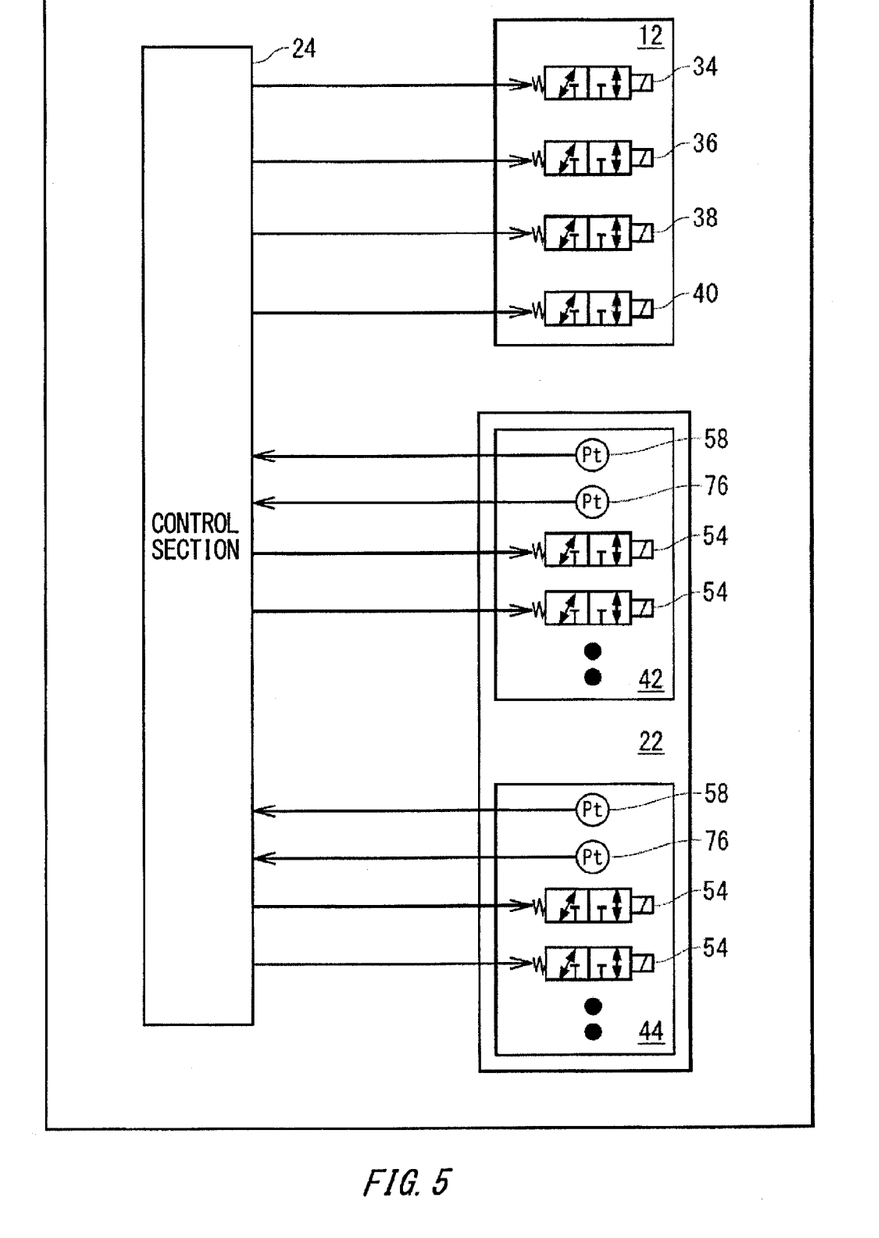
FIG. 5 is a block diagram for explaining the control system of the temperature control apparatus 10.

FIG. 5 is a block diagram for explaining the control system of the temperature control apparatus 10. As shown in FIG. 5, the control section 24 is connected to be able to transmit and receive signals to and from the main switch 34, the sub switch 36, the main return switch 38, and the sub return switch 40 of the chiller section 12. Accordingly, the control section 24 controls the main switch 34, the sub switch 36, the main return switch 38, and the sub return switch 40, to control the connection of the first fluid source 30 and the second fluid source 32, to the main flow path 14, sub flow path 16, the main return flow path 18, and the sub return flow path 20.

The control section 24 is connected to the flow path temperature detecting section 58 and the exchange temperature detecting section 76 of the preheating chamber 42. Accordingly, the control section 24 can obtain the temperature information of the mixed fluid FLm flowing through the mixture flow path 56, from the flow path temperature detecting section 58 of the preheating chamber 42. In addition, the control section 24 can obtain the temperature information of the heat exchange section 70, from the exchange temperature detecting section 76 of the preheating chamber 42. The control section 24 is connected to each flow rate adjusting section 54 of the preheating chamber 42. The control section 24 controls each flow rate adjusting section 54 of the preheating chamber 42 based on the temperature information of the mixed fluid FLm and the temperature information of the heat exchange section 70, thereby adjusting the amount of the fluid flowing from the sub flow path 16 to the mixture flow path 56, in relation to the fluid flowing through the main flow path 14. For example, the control section 24 PWM (pulse width modulation) controls the flow rate adjusting section 54. By doing so, the control section 24 controls the temperature of the mixed fluid FLm flowing to the heat exchange section 70 of the preheating chamber 42.

In addition, the control section 24 controls each flow rate adjusting section 54 of the test section 44, just as each flow rate adjusting section 54 of the preheating chamber 42.

Figure 6:
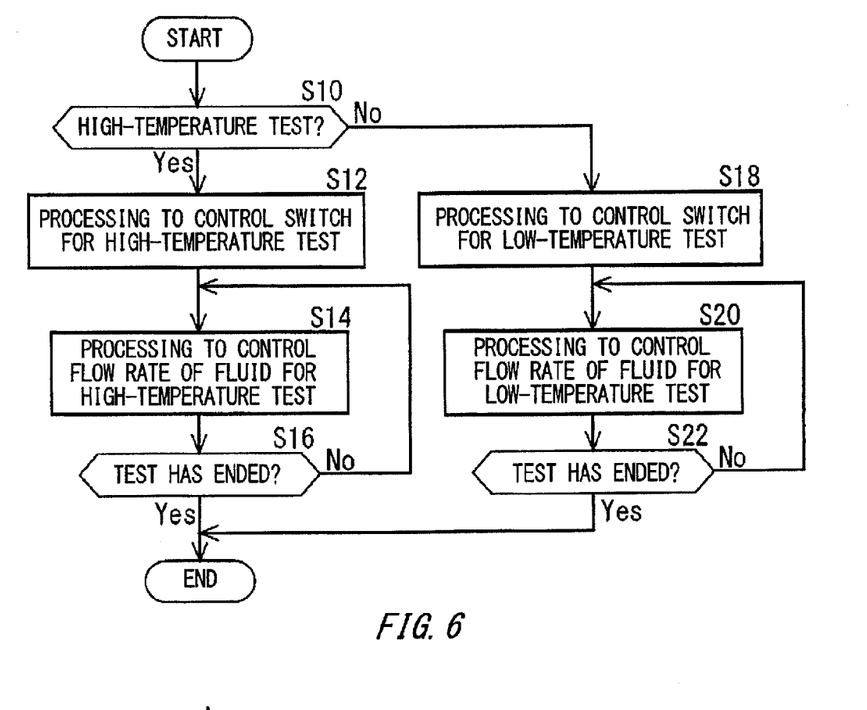
FIG. 6 is a flow chart of temperature control processing performed by a control section 24.
Figure 7:
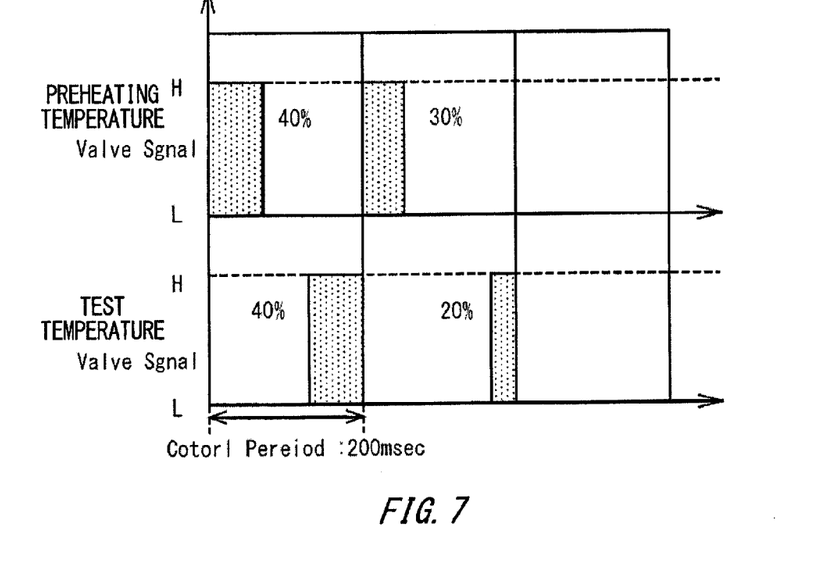
FIG. 7 explains PWM control of a flow rate adjusting section 54 performed by the control section 24.

The following explains temperature control processing of the temperature control apparatus 10. FIG. 6 is a flow chart of temperature control processing performed by the control section 24. FIG. 7 explains PWM control of a flow rate adjusting section 54 performed by the control section 24. The temperature control processing is executed by the control section 24 reading a temperature control program.

First, the control section 24 judges whether the present test is a high-temperature test or not (S10). For example, the control section 24 judges whether the present test is a high-temperature test or a low-temperature test, using a predetermined test program or the like. If judging that it is a high-temperature test (S10: Yes), the control section 24 executes processing to control the switch for the high-temperature test (S12).

Here, at the beginning of the processing to control the switch for the high-temperature test, the temperature of the fluid is the temperature for a low-temperature test executed prior to the high-temperature test. Therefore, the temperature of the first fluid FL1 is 145 degrees Celsius, and the temperature of the second fluid FL2 is −15 degrees Celsius, for example. In this state, the control section 24 controls the main switch 34 in the high-temperature test, to connect the main flow path 14 to the first fluid source 30, as well as controlling the main return switch 38 to connect the main return flow path 18 to the first fluid source 30. In addition, the control section 24 controls the sub switch 36 to connect the sub flow path 16 to the second fluid source 32, as well as controlling the sub return switch 40 to connect the sub return flow path 20 to the second fluid source 32.

By doing so, the first fluid FL1 at high temperature supplied from the first fluid source 30 flows through the main flow path 14, to be branched by the main branch section 50, thereby being supplied to the handler section 22. In addition, the second fluid FL2 at low temperature supplied from the second fluid source 32 flows through the sub flow path 16, to be branched by the sub branch section 52, thereby being supplied to the handler section 22.

Furthermore, the control section 24 controls the flow rate adjusting section 54, to connect the sub flow path 16 to the mixture flow path 56. By doing so, the first fluid FL1 and the second fluid FL2 flow to the mixture flow path 56, to be mixed to be a mixed fluid FLm. The mixed fluid FLm flows through the mixture flow path 56 and the heat exchange flow path 74 of the heat exchange section 70, to exchange heat with the device under test DUT, to heat the device under test DUT. The mixed fluid FLm having exchanged heat with the device under test DUT merges at the mixture merge section 62 and the main merge section 64, and thereafter flows through the main return flow path 18 and returns to the first fluid source 30.

In this state, if judging that the temperature of the device under test DUT and the heat exchange section 70 approaches the targeted temperature, the control section 24 sets the first temperature of the first fluid FL1 of the first fluid source 30 to be low, and the second temperature of the second fluid FL2 of the second fluid source 32 to be low. Accordingly, as the targeted temperature is raised, the control section 24 lowers the first temperature of the first fluid FL1 for the first fluid source 30, and lowers the second temperature of the second fluid FL2 for the second fluid source 32. For example, when the targeted temperature is 80 degrees Celsius, the first temperature is 90 degrees Celsius, and the second temperature is −65 degrees Celsius.

In this way, at the beginning of the high-temperature test, the control section 24 can set the device under test DUT under low temperature state to high temperatures quickly, by causing the first fluid FL1 and the second fluid FL2 in high temperatures being the temperature of the low-temperature test to flow. Furthermore, the control section 24 lowers the temperature of the first fluid FL1 and the second fluid FL2, when the device under test DUT has approached the targeted temperature. In particular, the control section 24 lowers the first fluid FL1 to substantially the targeted temperature, thereby being able to lower the flow rate of the second fluid FL2. Furthermore, by lowering the flow rate of the second fluid FL2, the mixed fluid FLm can return to the first fluid source 30 in the state close to the first temperature, and therefore the returned mixed fluid FLm can be reused as the first fluid FL1, with substantially no heating.

Next, the control section 24 executes the processing to control the flow rate of the fluid for high-temperature tests of the preheating chamber 42 and the test section 44 (S14). The control section 24 controls the flow rate adjusting section 54 of the preheating chamber 42 and the test section 44 based on the temperature information of the heat exchange section 70 obtained from the exchange temperature detecting section 76 and the temperature information of the mixed fluid FLm obtained from the flow path temperature detecting section 58, thereby controlling the temperature of the device under test DUT and of the heat exchange section 70.

Specifically, the control section 24 adjusts the temperature of the heat exchange section 70 by adjusting the duty ratio of the flow rate adjusting section 54 by PWM control. Note that the control section 24 determines the duty ratio based on the temperature information of the mixed fluid FLm obtained from the flow path temperature detecting section 58 and the temperature information of the heat exchange section 70 obtained from the exchange temperature detecting section 76, as well as the table information pre-set in association with the duty ratio. For example, as shown in FIG. 7, the control section 24 controls the flow rate adjusting sections 54 of the preheating chamber 42 and of the test section 44, to connect the sub flow path 16 to the mixture flow path 56, during 40% of one period. One example of one period is 200 msec. Therefore, during 40% of one period, the first fluid FL1 and the second fluid FL2 are supplied to the mixture flow path 56. As a result, the mixed fluid FLm in which the first fluid FL1 and the second fluid FL2 are mixed is supplied to the heat exchange section 70, to heat or cool the device under test DUT. Thereafter, the mixed fluid FLm flows through the main return flow path 18, merges in the mixture merge section 62 and the main merge section 64, and returns to the first fluid source 30.

In addition, the control section 24 controls the flow rate adjusting sections 54 of the preheating chamber 42 and the test section 44, to connect the sub flow path 16 to the sub return flow path 20, during 60% of one period. Accordingly, during 60% of one period, only the first fluid FL1 is supplied to the mixture flow path 56, and the second fluid FL2 flows through the sub return flow path 20 without being supplied to the mixture flow path 56, merges in the sub merge section 66, and returns to the second fluid source 32. In this way, by setting, to be a part of one period, the time period during which the sub flow path 16 is connected to the mixture flow path 56, the pressure of the second fluid FL2 flowing through the sub flow path 16 can be improved. As a result, the first fluid FL1 flowing through the main flow path 14 is assuredly mixed with the second fluid FL2 flowing through the sub flow path 16.

In this state, if judging that the temperature information obtained from the flow path temperature detecting section 58 and the exchange temperature detecting section 76 is lower than a pre-set targeted temperature, the control section 24 controls the flow rate adjusting section 54 to decrease a time during which the sub flow path 16 is connected to the mixture flow path 56. For example, in the next one period, the control section 24 controls the flow rate adjusting section 54 of the preheating chamber 42, to decrease a time during which the sub flow path 16 is connected to the mixture flow path 56 down to 30%. In addition, the control section 24 controls the flow rate adjusting section 54 of the test section 44, to decrease a time during which the sub flow path 16 is connected to the mixture flow path 56 down to 20%. By doing so, the flow rate of the second fluid FL2 of a low temperature supplied from the sub flow path 16 is decreased, to raise the temperature of the heat exchange section 70. Conversely, when judging that the temperature information obtained from the flow path temperature detecting section 58 and the exchange temperature detecting section 76 is higher than a pre-set targeted temperature, the control section 24 controls the flow rate adjusting section 54 to increase a time during which the sub flow path 16 is connected to the mixture flow path 56. By doing so, the flow rate of the second fluid FL2 of a low temperature supplied from the sub flow path 16 is increased, to lower the temperature of the heat exchange section 70.

Here, the control section 24 may preferably displace the time during which the sub flow path 16 of the preheating chamber 42 is connected to the mixture flow path 56 and the time during which the sub flow path 16 of the test section 44 is connected to the mixture flow path 56 in one period. For example, the control section 24 may cause a fluid to flow from the sub flow path 16 to the mixture flow path 56 during the first time period starting from the start of each cycle of a predetermined period, e.g., 40% from the start, for the flow rate adjusting section 54 of the preheating chamber 42, and cause a fluid to flow from the sub flow path 16 to the mixture flow path 56 during the second time period ending at the end of each cycle, e.g., 40% from the end, for the flow rate adjusting section 54 of the test section 44. Accordingly, the second fluid FL2 supplied to the preheating chamber 42 does not interfere with the second fluid FL2 supplied to the test section 44, which facilitates adjustment of the flow rate, to make it easier to control the temperature of each heat exchange section 70 of the preheating chamber 42 and of the test section 44. Note that the control section 24 may control switching of the flow path by the eight flow rate adjusting sections 54 provided in the preheating chamber 42 at the same timing. The control section 24 may control switching of the flow path by the eight flow rate adjusting sections 54 provided in the test section 44 at the same timing.

Thereafter, the control section 24 repeats Step S14 until the high-temperature test ends (S16: No). When judging that the high-temperature test has ended (S16: Yes), the control section 24 ends the temperature control processing. Note that it is possible to return to the beginning of the flow, to repeat the processing from Step S10 again, to perform a low-temperature test.

On the other hand, when judging that it is not a high-temperature test (i.e., when judging that it is a low-temperature test) (S10: No), the control section 24 performs processing to control the switch for a low-temperature test (S18).

At the beginning of the processing to control the switch for the low-temperature test, the temperature of the fluid is the temperature for a high-temperature test executed prior to the low-temperature test. Therefore, the temperature of the first fluid FL1 is 90 degrees Celsius, and the temperature of the second fluid FL2 is −65 degrees Celsius, for example. In this state, the control section 24 controls the main switch 34, to connect the main flow path 14 to the second fluid source 32, as well as controlling the main return switch 38 to connect the main return flow path 18 to the second fluid source 32. In addition, the control section 24 controls the sub switch 36 to connect the sub flow path 16 to the first fluid source 30, as well as controlling the sub return switch 40 to connect the sub return flow path 20 to the first fluid source 30.

By doing so, the second fluid FL2 at low temperature supplied from the second fluid source 32 is supplied to the handler section 22 via the main flow path 14, as well as the first fluid FL1 at high temperature supplied from the first fluid source 30 is supplied to the handler section 22 via the sub flow path 16.

Furthermore, the control section 24 controls the flow rate adjusting section 54, to connect the sub flow path 16 to the mixture flow path 56. By doing so, the first fluid FL1 and the second fluid FL2 flow to the mixture flow path 56, to be mixed to be a mixed fluid FLm. The mixed fluid FLm flows through the mixture flow path 56 and the heat exchange flow path 74 of the heat exchange section 70, to exchange heat with the device under test DUT, to cool the device under test DUT. The mixed fluid FLm having exchanged heat with the device under test DUT merges at the mixture merge section 62 and the main merge section 64, and thereafter flows through the main return flow path 18 and returns to the second fluid source 32.

In this state, if judging that the temperature of the device under test DUT and the heat exchange section 70 approaches the targeted temperature, the control section 24 sets the first temperature of the first fluid FL1 of the first fluid source 30 to be high, and the second temperature of the second fluid FL2 of the second fluid source 32 to be high. Accordingly, as the targeted temperature is lowered, the control section 24 raises the first temperature of the first fluid FL1 for the first fluid source 30, and raises the second temperature of the second fluid FL2 for the second fluid source 32. For example, when the targeted temperature is −5 degrees Celsius, the first temperature is 145 degrees Celsius, and the second temperature is −15 degrees Celsius.

In this way, at the beginning of the low-temperature test, the control section 24 can set the device under test DUT under high temperature state to low temperatures quickly, by causing the first fluid FL1 and the second fluid FL2 in low temperatures being the temperature of the high-temperature test to flow. Furthermore, the control section 24 raises the temperature of the first fluid FL1 and the second fluid FL2, when the device under test DUT has approached the targeted temperature. In particular, the control section 24 raises the second fluid FL2 to substantially the targeted temperature, thereby being able to lower the flow rate of the first fluid FL1. Furthermore, by reducing the flow rate of the first fluid FL1, the mixed fluid FLm can return to the second fluid source 32 in the state close to the second temperature, and therefore the returned mixed fluid FLm can be reused as the second fluid FL2, with substantially no cooling.

Next, the control section 24 executes the processing to control the flow rate of the fluid for low-temperature tests of the preheating chamber 42 and the test section 44 (S20). The control section 24 controls the flow rate adjusting section 54 of the preheating chamber 42 and the test section 44 based on the temperature information of the mixed fluid FLm and the heat exchange section 70 obtained from the flow path temperature detecting section 58 and the exchange temperature detecting section 76, thereby controlling the temperature of the heat exchange section 70. Specifically, the control section 24 adjusts the temperatures of the device under test DUT and of the heat exchange section 70 by adjusting the duty ratio of the flow rate adjusting section 54 by PWM control.

For example, when judging that the temperature information obtained from the flow path temperature detecting section 58 and the exchange temperature detecting section 76 is lower than a pre-set targeted temperature, the control section 24 controls the flow rate adjusting section 54 to increase a time during which the sub flow path 16 is connected to the mixture flow path 56. By doing so, the flow rate of the first fluid FL1 of a high temperature supplied from the sub flow path 16 is increased, to raise the temperature of the heat exchange section 70.

Conversely, if judging that the temperature information obtained from the flow path temperature detecting section 58 and the exchange temperature detecting section 76 is higher than a pre-set targeted temperature, the control section 24 controls the flow rate adjusting section 54 to decrease a time during which the sub flow path 16 is connected to the mixture flow path 56. By doing so, the flow rate of the first fluid FL1 of a high temperature supplied from the sub flow path 16 is decreased, to lower the temperature of the heat exchange section 70.

Thereafter, the control section 24 repeats Step S20 until the low-temperature test ends (S22: No). When judging that the low-temperature test has ended (S22: Yes), the control section 24 ends the temperature control processing. Note that it is possible to return to the beginning of the flow, to repeat the processing from Step S10 again, to perform a high-temperature test.

As stated above, the temperature control apparatus 10 adjusts the amount of mixture between the first fluid FL1 and the second fluid FL2 by means of the flow rate adjusting section 54 provided on the sub flow path 16, without providing any flow rate adjusting section for the main flow path 14 in the handler section 22. This helps reduce the number of flow rate adjusting sections 54 being valves, in the temperature control apparatus 10. This further helps simplify the configuration as well as simplifying the control of the flow rate adjusting sections 54.

In the temperature control apparatus 10, the main switch 34 and the sub switch 36 are provided in the chiller section 12. Accordingly, the temperature control apparatus 10 can use the main switch 34 to switch the main flow path 14 between the first fluid source 30 and the second fluid source 32, and use the sub switch 36 to switch the sub flow path 16 between the first fluid source 30 and the second fluid source 32. Accordingly, while reducing the number of flow rate adjusting sections 54 of the handler section 22, the heat exchange section 70 can be heated or cooled, enabling to perform a high-temperature test and a low-temperature test.

In addition, in the temperature control apparatus 10, the main return switch 38 and the sub return switch 40 are provided in the chiller section 12. Accordingly, the temperature control apparatus 10 can return the mixed fluid FLm having heated or cooled the device under test DUT in the heat exchange section 70, to the first fluid source 30 or the second fluid source 32 connected to the main flow path 14, via the main return switch 38. In addition, the temperature control apparatus 10 can return the fluid left unmixed to the first fluid source 30 or the second fluid source 32 connected to the sub flow path 16, via the sub return switch 40. As a result, the temperature control apparatus 10 can reduce the number of flow rate adjusting sections 54, while maintaining the utilization efficiency of the fluid.

Figure 8:
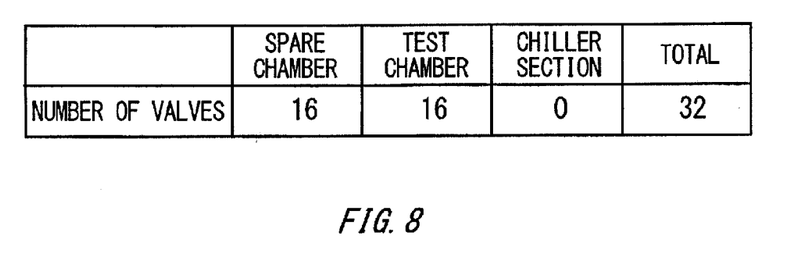
FIG. 8 is a table for explaining the number of valves of a temperature control apparatus being a comparison target.
Figure 9:
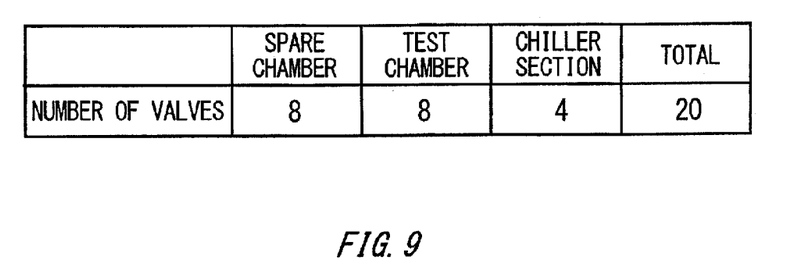
FIG. 9 is a table for explaining the number of valves of the temperature control apparatus 10.

Here, the number of reduction of the number of valves is explained below. Note that the heating target or the cooling target includes eight heat exchange sections 70 supporting four pushers 78 in 2 by 2 formation. FIG. 8 is a table for explaining the number of valves of a temperature control apparatus being a comparison target. FIG. 9 is a table for explaining the number of valves of the temperature control apparatus 10.

As shown in FIG. 8, the temperature control apparatus being a comparison target is provided with a flow rate adjusting section in each of the main flow path and the sub flow path. Therefore, there are 16 valves provided in the preheating chamber and the test chamber. On the other hand, there is no valve provided in the chiller section. Therefore, the comparison target includes 32 valves total.

As shown in FIG. 9, in the temperature control apparatus 10 according to the present embodiment, there is no valve provided in the main flow path 14, but 8 valves, i.e. flow rate adjusting sections 54 of the sub flow path 16 are provided in the preheating chamber 42 and the test section 44, respectively. In addition, the total of 4 valves are provided in the chiller section 12 in the temperature control apparatus 10, each one in the main switch 34, the sub switch 36, the main return switch 38, and the sub return switch 40. Consequently, there are 20 valves are provided in total in the temperature control apparatus 10 according to the present embodiment.

In this way, the temperature control apparatus 10 according to the present embodiment can reduce the number of valves by 12 compared to the comparison target. Here, as the number of heat exchange sections 70 and the number of pushers 78 to be heated or cooled at once increase, the difference between the number of valves required for the preheating chamber 42 and the test section 44 according to the present embodiment and the number of valves required for the preheating chamber 42 and the test section 44 of the comparison target increases. On the other hand, the number of valves provided in the chiller section 12 according to the present embodiment may still be four, regardless of the number of heat exchange sections 70 or the number of pushers 78. Accordingly, as the number of devices under test DUT to be tested at once increases and the number of heat exchange sections 70 and the number of pushers 78 increase, the difference between the number of valves required in the present embodiment and the number of valves required in the comparison target increases. Furthermore, the temperature control apparatus 10 can have a smaller flow rate adjusting section 54 because the flow rate adjusting section 54 is provided in the sub flow path 16 having a smaller cross-section area.

Figure 10:
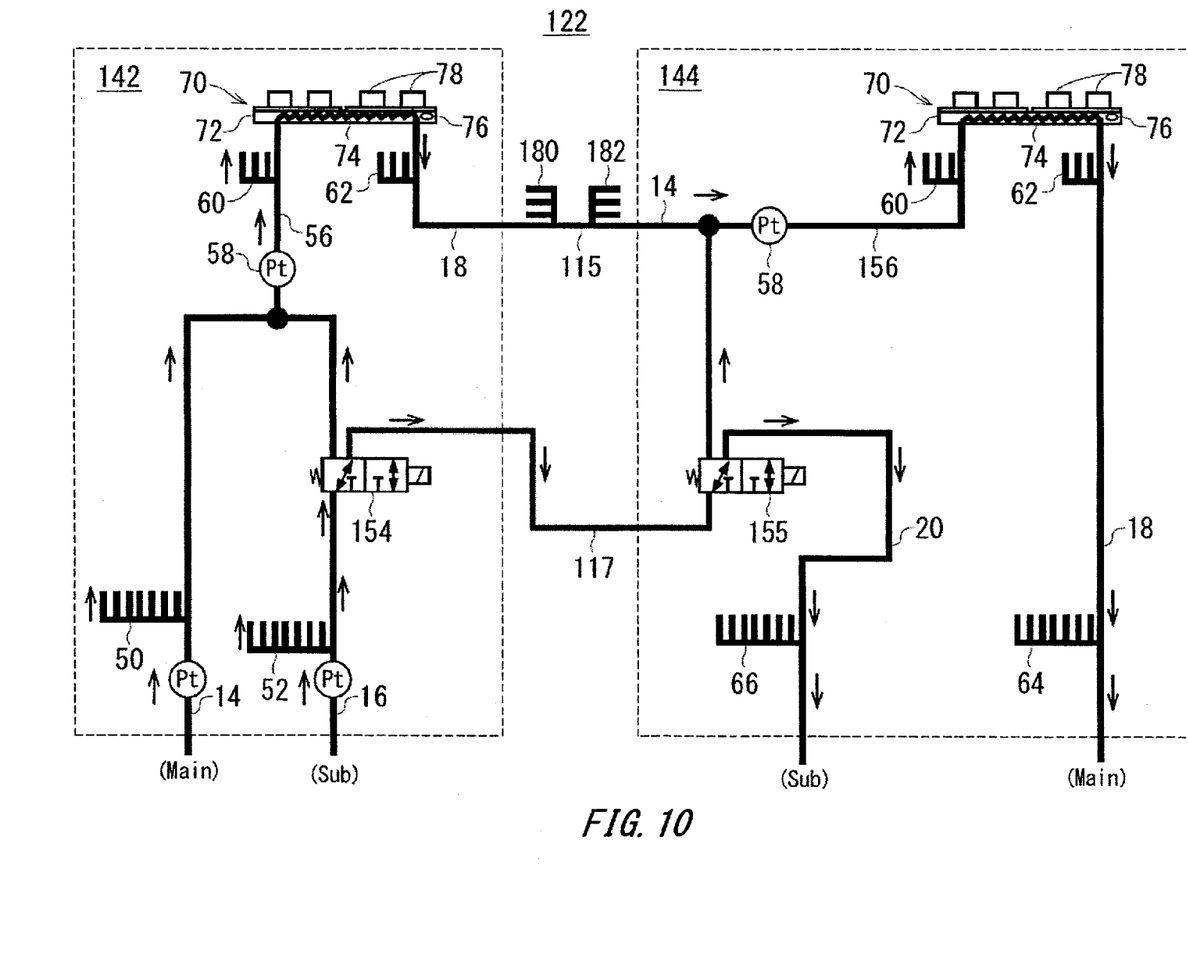
FIG. 10 is a configuration overview of a modified handler section 122.

Next, the modified handler section 122 is explained. FIG. 10 is a configuration overview of a modified handler section 122. Note that the same configuration as that of the handler section 22 is assigned the same reference number, and its explanation is omitted in the following.

As shown in FIG. 10, the handler section 122 includes a preheating chamber 142, a main intermediate flow path 115, an intermediate merge section 180, an intermediate branch section 182, a sub intermediate flow path 117, and a test section 144. In the present embodiment, a plurality of sets of heat exchange section 70, main flow path 14, sub flow path 16, mixture flow path 56, 156, main return flow path 18, sub return flow path 20, and flow rate adjusting section 154, 155 are cascade connected.

In the present embodiment, the main flow path 14 and the sub flow path 16 extending from the chiller section 12 are only provided in the preheating chamber 142, and not in the test section 144. Therefore, for the first one, i.e., the heat exchange section 70 of the preheating chamber 142, a corresponding main flow path 14 is connected to the main switch 34, and the corresponding sub flow path 16 is connected to the sub switch 36. On the other hand, the main return flow path 18 and the sub return flow path 20 extending to the chiller section 12 are provided in the test section 144, but not in the preheating chamber 142. Therefore, for the last one, i.e., the heat exchange section 70 of the test section 144, a corresponding main return flow path 18 is connected to the main return switch 38, and the corresponding sub return flow path 20 is connected to the sub return switch 40.

The preheating chamber 142 includes a main branch section 50, a sub branch section 52, a plurality of flow rate adjusting sections 154, a plurality of mixture flow paths 56, a plurality of flow path temperature detecting sections 58, a mixture branch section 60, a mixture merge section 62, and a plurality of heat exchange sections 70.

The flow rate adjusting section 154 switches whether to cause a fluid to flow from the sub flow path 16 to the mixture flow path 56, or to flow from the sub flow path 16 to the sub intermediate flow path 117 that can also function as a sub return flow path 20 of the preheating chamber 142. An example of the flow rate adjusting section 154 is a valve having three ports.

The main intermediate flow path 115 extends from the heat exchange flow path 74 of the heat exchange section 70 of the preheating chamber 142 to the test section 144. The main intermediate flow path 115 causes a mixed fluid FLm flowing through the heat exchange flow path 74 to the test section 144. In other words, for the second and ones thereafter, i.e., the heat exchange section 70 of the test section 144, the main intermediate flow path 115 connects the corresponding main flow path 14 to the immediately preceding one, i.e., the main return flow path 18 from the heat exchange section 70 of the preheating chamber 142.

The intermediate merge section 180 is provided halfway through the main intermediate flow path 115. The intermediate merge section 180 merges a plurality of main intermediate flow paths 115. In the present embodiment, the intermediate merge section 180 merges four main intermediate flow paths 115. Note that the intermediate merge section 180 may merge the main intermediate flow paths 115, up to the number of heat exchange sections 70 to be preheated or precooled at once in the preheating chamber 142. Therefore, the intermediate merge section 180 may merge 8 main intermediate flow paths 115 at the maximum.

The intermediate branch section 182 is provided halfway through the main intermediate flow path 115 and in the further downstream side than the intermediate merge section 180. The intermediate branch section 182 branches the main intermediate flow path 115. The number of branches of the intermediate branch section 182 is the same as the number of merges of the intermediate merge sections 180.

The sub intermediate flow path 117 connects the sub flow path 16 and the main intermediate flow path 115 or the sub return flow path 20, via the flow rate adjusting sections 154, 155. The sub intermediate flow path 117 causes the fluid flowing through the sub flow path 16 to either the main intermediate flow path 115 or the sub return flow path 20. In other words, in the sub intermediate flow path 117, for the second one or thereafter, i.e., the heat exchange section 70 of the test section 144, the corresponding sub flow path 16 is connected to the immediately preceding one, i.e., the sub return flow path 20 from the heat exchange section 70 of the preheating chamber 142.

In this way, by reducing the number of flow paths by merging a part of the main intermediate flow paths 115 by the intermediate merge section 180, the entire length of the flow paths can be shortened, as well as enabling to simplify installation of the flow paths.

The test section 144 is connected to the downstream of the preheating chamber 142 in the flow of the fluid. The test section 144 includes a plurality of flow rate adjusting sections 155, a plurality of mixture flow paths 156, a plurality of flow path temperature detecting sections 58, a mixture branch section 60, a mixture merge section 62, a main merge section 64, sub merge section 66, and a plurality of heat exchange sections 70. The heat exchange section 70 of the test section 44 adjusts the temperature of the device under test DUT being tested.

The flow rate adjusting section 155 switches whether to cause a fluid to flow from the sub intermediate flow path 117 to the mixture flow path 156, or from the sub intermediate flow path 117 to the sub return flow path 20, in the test section 144. An example of the flow rate adjusting section 155 is a valve having three ports.

One end of the mixture flow path 156 is connected to the sub intermediate flow path 117 and the main intermediate flow path 115 functioning as a main return flow path 18 of the preheating chamber 142. Therefore, the mixture flow path 156 causes, to flow, a new mixed fluid FLm resulting from mixing the mixed fluid FLm flowing through the main intermediate flow path 115 and the fluid flowing through the sub intermediate flow path 117. The other end of the mixture flow path 156 is connected to the heat exchange section 70 of the test section 144. Therefore, the mixture flow path 156 causes the new mixed fluid FLm to flow to the heat exchange section 70.

In the present embodiment, too, the control section 24 controls the flow rate adjusting sections 54, 155 based on PWM control. The control section 24 controls the flow rate adjusting sections 154, 155, so that the timing at which the fluid flows from the sub flow path 16 to the mixture flow path 56 in the preheating chamber 142 does not overlap with the timing at which the fluid flows from the sub intermediate flow path 117 to the mixture flow path 156 in the test section 144.

Next, the operation of the handler section 122 is explained.

First, the operation of the handler section 122 in preheating chamber 142 during a high-temperature test is explained. In the preheating chamber 142, the first fluid FL1 is supplied through the main flow path 14, and the second fluid FL2 is supplied through the sub flow path 16. The first fluid FL1 is branched by the main branch section 50 after flowing through the main flow path 14, and then flows into the mixture flow path 56. The second fluid FL2 is branched by the sub branch section 52 after flowing through the sub flow path 16, and then flows into the flow rate adjusting section 154.

Here, the control section 24 controls the flow rate adjusting section 154 based on the temperature information of the mixed fluid FLm obtained from the exchange temperature detecting section 76 and the flow path temperature detecting section 58 of the preheating chamber 142. For example, when judging that the temperature of the mixed fluid FLm is higher than the targeted temperature, the control section 24 controls the flow rate adjusting section 154 to set, to be higher, the duty ratio at which the sub flow path 16 is connected to the mixture flow path 56. Accordingly, the flow rate of the second fluid FL2 having a low temperature flowing from the sub flow path 16 to the mixture flow path 56 increases, to lower the temperature of the mixed fluid FLm. On the other hand, when judging that the temperature of the mixed fluid FLm is lower than the targeted temperature, the control section 24 controls the flow rate adjusting section 154 to set, to be higher, the duty ratio at which the sub flow path 16 is connected to the sub intermediate flow path 117. Accordingly, the flow rate of the second fluid FL2 having a low temperature flowing from the sub flow path 16 to the mixture flow path 56 decreases, to raise the temperature of the mixed fluid FLm.

Thereafter, the mixed fluid FLm heats or cools the device under test DUT in the heat exchange section 70 of the preheating chamber 142, flows through the main intermediate flow path 115, and then is supplied to the test section 144. On the other hand, the second fluid FL2 flows from the sub flow path 16 to the sub intermediate flow path 117, and then is supplied to the test section 144, while the flow rate adjusting section 154 is connecting the sub flow path 16 to the sub intermediate flow path 117.

In the test section 144, the mixed fluid FLm flows through the main intermediate flow path 115, is merged or branched by the intermediate merge section 180 and the intermediate branch section 182, and then flows into the mixture flow path 156. On the other hand, the second fluid FL2 flows through the sub intermediate flow path 117, and reaches the flow rate adjusting section 155.

Here, the control section 24 controls the flow rate adjusting section 155 based on the temperature information of the mixed fluid FLm obtained from the exchange temperature detecting section 76 and the flow path temperature detecting section 58 of the test section 144. For example, when judging that the temperature of the mixed fluid FLm is higher than the targeted temperature, the control section 24 controls the flow rate adjusting section 155 to set, to be higher, the duty ratio at which the sub intermediate flow path 117 is connected to the mixture flow path 156. Accordingly, the flow rate of the second fluid FL2 having a low temperature flowing from the sub intermediate flow path 117 to the mixture flow path 156 increases, to lower the temperature of the mixed fluid FLm flowing through the mixture flow path 156. On the other hand, when judging that the temperature of the mixed fluid FLm is lower than the targeted temperature, the control section 24 controls the flow rate adjusting section 155 to set, to be higher, the duty ratio at which the sub intermediate flow path 117 is connected to the sub return flow path 20. Accordingly, the flow rate of the second fluid FL2 having a low temperature flowing from the sub intermediate flow path 117 to the mixture flow path 156 decreases, to raise the temperature of the mixed fluid FLm flowing through the mixture flow path 156.

Thereafter, the mixed fluid FLm having heated or cooled the device under test DUT in the heat exchange section 70 of the test section 144 flows through the main return flow path 18, and returns to the first fluid source 30 after being merged in the mixture merge section 62 and the main merge section 64. On the other hand, while the flow rate adjusting section 155 is connecting the sub intermediate flow path 117 to the sub return flow path 20, the second fluid FL2 flows from the sub intermediate flow path 117 to the sub return flow path 20, and returns to the second fluid source 32.

A low-temperature test of the handler section 122 is different only in terms of control by the control section 24, and so the explanation thereof is omitted.

The position, the connection of the configurations in each embodiment described above may be changed depending on each situation as necessary. In addition, the numerical values such as number of configurations or numerical value of the fluid or the like can be changed depending on each situation as necessary. In addition, the embodiments can be combined depending on each situation as necessary.

In the embodiments described above, the first fluid source 30 causes, to flow, the first fluid FL1 to both of the main flow path 14 and the sub flow path 16. However, it is possible to configure the first fluid source 30 to cause to flow the first fluid FL1 only to one flow path, e.g., only to main flow path 14. Likewise, in the embodiments described above, the second fluid source 32 causes, to flow, the second fluid FL2 to both of the main flow path 14 and the sub flow path 16. However, it is possible to configure the second fluid source 32 to cause to flow the second fluid FL2 only to one flow path, e.g., only to sub flow path 16.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The claims, specification and drawings describe the processes of an apparatus, a system, a program and a method by using the terms such as operations, procedures, steps and stages. When a reference is made to the execution order of the processes, wording such as "before" or "prior to" is not explicitly used. The processes may be performed in any order unless an output of a particular process is used by the following process. In the claims, specification and drawings, a flow of operations may be explained by using the terms such as "first" and "next" for the sake of convenience. This, however, does not necessarily indicate that the operations should be performed in the explained order.

What is claimed is:

1. A temperature control apparatus for controlling a temperature of a device, comprising;
   a heat exchange section that exchanges heat with the device;
   a main flow path that causes a fluid to flow;
   a sub flow path that causes, to flow, a fluid having a temperature different from a temperature of the fluid flowing through the main flow path a mixture flow path that merges the fluids from the main flow path and the sub flow path and causes the merged fluids to flow to the heat exchange section; and a flow rate adjusting section that is provided on the sub flow path, and adjusts an amount of a fluid flowing from the sub flow path to the mixture flow path, in relation to the fluid flowing through the main flow path, while a flow rate of the fluid flowing from the main flow path to the mixture flow path is kept unchanged, wherein no flow rate adjusting section is provided on the main flow path.

2. The temperature control apparatus according to claim 1, wherein
a pressure of the fluid flowing through the sub flow path is higher than a pressure of the fluid flowing through the main flow path.

3. The temperature control apparatus according to claim 1, wherein
the inside of the sub flow path has a cross-section area smaller than a cross-section area of the inside of the main flow path.

4. The temperature control apparatus according to claim 1, comprising:
a first fluid source that causes, to flow, a fluid to the main flow path by adjusting a temperature of the fluid to a first temperature, and receives a fluid having flown through the heat exchange section, via a main return flow path; and
a second fluid source that causes, to flow, a fluid to the sub flow path by adjusting a temperature of the fluid to a second temperature, and receives a fluid not having flown from the sub flow path to the mixture flow path, via a sub return flow path.

5. A test system comprising:
the temperature control apparatus according to claim 1; and
a test apparatus that supplies a test signal to a device whose temperature has been controlled by the temperature control apparatus to test the device.

6. A temperature control apparatus for controlling a temperature of a device, comprising:
a heat exchange section that exchanges heat with the device;
a main flow path that causes a fluid to flow;
a sub flow path that causes, to flow, a fluid having a temperature different from a temperature of the fluid flowing through the main flow path;
a mixture flow path that merges the fluids from the main flow path and the sub flow path and causes the merged fluids to flow to the heat exchange section;
a flow rate adjusting section that adjusts an amount of a fluid flowing from the sub flow path to the mixture flow path, in relation to the fluid flowing through the main flow path;
a first fluid source that causes, to flow, a fluid to the main flow path by adjusting a temperature of the fluid to a first temperature, and receives a fluid having flown through the heat exchange section, via a main return flow path;
a second fluid source that causes, to flow, a fluid to the sub flow path by adjusting a temperature of the fluid to a second temperature, and receives a fluid not having flown from the sub flow path to the mixture flow path, via a sub return flow path;
a main switch that switches which one of the first fluid source and the second fluid source is connected to the main flow path; and a sub switch that switches to connect a fluid source out of the first fluid source and the second fluid source, which is not connected to the main flow path, to the sub flow path.

7. The temperature control apparatus according to claim 6, further comprising:
a main return switch that connects a fluid source out of the first fluid source and the second fluid source, which is connected to the main flow path, to the main return flow path; and
a sub return switch that connects a fluid source out of the first fluid source and the second fluid source, which is connected to the sub flow path, to the sub return flow path.

8. The temperature control apparatus according to claim 7, wherein
a plurality of sets of the heat exchange section, the main flow path, the sub flow path, the mixture flow path, the main return flow path, the sub return flow path, and the flow rate adjusting section are cascade connected,
for a first one of the heat exchange sections, a corresponding one of the main flow paths is connected to the main switch, and a corresponding one of the sub flow paths is connected to the sub switch,
for a second one or ones thereafter of the heat exchange sections, a corresponding one of the main flow paths is connected to the main return flow path from an immediately preceding one of the heat exchange sections, and a corresponding one of the sub flow paths is connected to the sub return flow path corresponding to the immediately preceding heat exchange section, and
for a last one of the heat exchange sections, a corresponding one of the main return flow paths is connected to the main return switch, and a corresponding one of the sub return flow paths is connected to the sub return switch.

9. The temperature control apparatus according to claim 8, wherein
the first one of the heat exchange sections preheats a device under test in a preheating chamber, and
a second one of the heat exchange sections connected more downstream than the first heat exchange section adjusts a temperature of the device under test being tested.

10. The temperature control apparatus according to claim 6, wherein
the first fluid source adjusts a temperature of a fluid to the first temperature that is higher than the second temperature, and
the first fluid source raises the first temperature in response to lowering of a targeted temperature of a fluid to flow to the heat exchange section.

11. The temperature control apparatus according to claim 6, wherein
the second fluid source adjusts a temperature of a fluid to the second temperature that is lower than the first temperature, and
the second fluid source lowers the second temperature in response to raising of a targeted temperature of a fluid to flow to the heat exchange section.

12. The temperature control apparatus according to claim 6, comprising
a plurality of sets of the heat exchange section, the main flow path, the sub flow path, the mixture flow path, the main return flow path, the sub return flow path, and the flow rate adjusting section, and further comprising:

a main branch section that branches a fluid from the main switch, to cause the fluid to flow to the plurality of main flow paths;

a main merge section that merges fluids from the plurality of main return flow paths, to cause the fluids to flow to the main switch;

a sub branch section that branches a fluid from the sub switch, to cause the fluid to flow to the plurality of sub flow paths; and a sub merge section that merges fluids from the plurality of sub return flow paths, to cause the fluids to flow to the sub switch.

13. The temperature control apparatus according to claim 12, wherein each of a plurality of the flow rate adjusting sections switches whether to cause, to flow, a fluid from the sub flow path to the mixture flow path or to cause to flow the fluid from the sub flow path to the sub return flow path, and the temperature control apparatus further comprising:

a control section that controls so that timings at which the plurality of flow rate adjusting sections flow a fluid from the sub flow path to the mixture flow path do not overlap each other.

14. The temperature control apparatus according to claim 13, wherein the control section, for the first one of the flow rate adjusting sections, causes, to flow, a fluid from the sub flow path to the mixture flow path during a first time period starting from a beginning of each cycle of a predetermined period, and for the second one of the flow rate adjusting sections, causes to flow a fluid from the sub flow path to the mixture flow path during a second time period ending at an end of each cycle.

15. A temperature control apparatus for controlling a temperature of a device, comprising;

a heat exchange section that exchanges heat with the device;

a main flow path that causes a fluid to flow;

a sub flow path that causes, to flow, a fluid having a temperature different from a temperature of the fluid flowing through the main flow path, an inside of the sub flow path having a cross-section area smaller than a cross-section area of an inside of the main flow path;

a mixture flow path that merges the fluids from the main flow path and the sub flow path and causes the merged fluids to flow to the heat exchange section; and a flow rate adjusting section that adjusts an amount of a fluid flowing from the sub flow path to the mixture flow path, in relation to the fluid flowing through the main flow path.

16. The temperature control apparatus according to claim 15, wherein the flow rate adjusting section adjusts a flow rate of the fluid flowing from the sub flow path to the mixture flow path while keeping the flow rate of the fluid flowing from the main flow path to the mixture flow path.

* * * * *